(12) United States Patent
Akita et al.

(10) Patent No.: US 7,351,347 B2
(45) Date of Patent: Apr. 1, 2008

(54) GALLIUM-NITRIDE DEPOSITION SUBSTRATE, METHOD OF MANUFACTURING GALLIUM-NITRIDE DEPOSITION SUBSTRATE, AND METHOD OF MANUFACTURING GALLIUM NITRIDE SUBSTRATE

(75) Inventors: Katsushi Akita, Itami (JP); Takuji Okahisa, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 456 days.

(21) Appl. No.: 10/482,434

(22) PCT Filed: Jan. 23, 2003

(86) PCT No.: PCT/JP03/00613

§ 371 (c)(1),
(2), (4) Date: Dec. 30, 2003

(87) PCT Pub. No.: WO03/094214

PCT Pub. Date: Nov. 13, 2003

(65) Prior Publication Data

US 2005/0064206 A1    Mar. 24, 2005

(30) Foreign Application Priority Data

Apr. 30, 2002    (JP)    ............................. 2002-127727

(51) Int. Cl.
*H01L 21/302*    (2006.01)
(52) U.S. Cl. .......................................... 216/79; 216/80
(58) Field of Classification Search .................. 438/22; 216/79, 80
See application file for complete search history.

(56) References Cited

U.S. PATENT DOCUMENTS 6,413,627 B1    7/2002    Motoki et al.
6,667,184 B2 *    12/2003    Motoki et al. ................. 438/22

FOREIGN PATENT DOCUMENTS

JP    03-116927 A    5/1991

(Continued)

OTHER PUBLICATIONS

A. Sakai and A. Usui, "Reduction of Dislocation Density in GaN Films by Epitaxial Lateral Overgrowth," Jpn. J. Appl. Phys., vol. 68, No. 7 (1999).

(Continued)

*Primary Examiner*—Duy-Vu N. Deo
*Assistant Examiner*—Patricia A. George
(74) *Attorney, Agent, or Firm*—James Judge (57) ABSTRACT

GaN crystal having few dislocations is grown by using together ELO-mask and defect-seeding-mask means. ELO masks make it so that GaN crystal does not grow directly, but grows laterally; defect-seeding masks make it so that closed defect-gathering regions in which defects are concentrated are grown.

Any of the materials SiN, SiON or $SiO_2$ is utilized for the ELO mask, while any of the materials Pt, Ni or Ti is utilized for the defect-seeding masks. With a sapphire, GaAs, spinel, Si, InP, SiC, etc. single-crystal substrate, or one in which a GaN buffer layer is coated onto a single-crystal substrate of these, as an under-substrate, the ELO mask and defect-seeding masks are provided complementarily and GaN is vapor-phase deposited.

6 Claims, 9 Drawing Sheets

FOREIGN PATENT DOCUMENTS

| | | | |
|---|---|---|---|
| JP | H08-064791 A | | 3/1996 |
| JP | H10-312971 A | | 11/1998 |
| JP | 2000-012900 A | | 1/2000 |
| JP | 2000-022212 A | | 1/2000 |
| JP | 2001-185498 A | | 7/2001 |
| JP | 2001-288000 A | | 10/2001 |
| JP | 2002270516 A | * | 9/2002 |
| JP | 2002-335051 A | | 11/2002 |
| WO | WO-99-023693 | | 5/1999 |

OTHER PUBLICATIONS

A. Usui, "Thick Layer Growth of GaN by Hydride Vapor Phase Epitaxy," Transactions of the Institute of Electronics, Information and Communication Engineers, C-11, vol. J81-C-11, No. 1 (Jan. 1998).

K. Motoki, et al., "Preparation of Large Freestanding GaN Substrates by Hydride Vapor Phase Epitaxy Using GaAs as a Starting Substrate," Jpn. J. Appl. Phys. vol. 40 (2001) pp. L140-L143.

* cited by examiner

GALLIUM-NITRIDE DEPOSITION SUBSTRATE, METHOD OF MANUFACTURING GALLIUM-NITRIDE DEPOSITION SUBSTRATE, AND METHOD OF MANUFACTURING GALLIUM NITRIDE SUBSTRATE

TECHNICAL FIELD

This invention relates to gallium-nitride (GaN) single-crystal substrates employed as substrates for blue light-emitting diodes (LEDs) and blue laser diodes (LDs), and relates to methods of manufacturing the substrates. Nitride-system blue light-emitting devices are sometimes called InGaN-system light-emitting devices because their active layer is an InGaN film, and at times they are also referred to simply as GaN systems. Because manufacturing GaN single-crystal substrates is difficult, at present manufacture is by hetero-epitaxially growing GaN thin films, InGaAs thin films, etc. onto a hexagonal-system sapphire substrate. Sapphire-substrate InGaN LEDs have demonstrated positive results in use, and have proven satisfactory in terms of brightness, reliability, and lifespan. Substrates for the InGaN-system LEDs widely being used at present are for the most part sapphire substrates. In other words, they are said to be "on-sapphire" InGaN LEDs.

Nevertheless, drawbacks with sapphire include the fact that it cleaves differently from the cleavage directions of GaN, and that it is insulative.

Given these circumstances; demands as to the desirability of fabricating blue light-emitting devices with single-crystal GaN made the substrate have been intense. GaN single-crystal substrates possess the same crystalline structure as the GaN thin films and InGaN thin films of the component elements for the devices, and possess a distinct cleavage quality. Doping them with impurities, moreover, ought to make them electrically conductive. Therefore, n-type electrodes can be formed on their bottom surface; and the possibility of separating the devices by means of the natural cleavage presents itself.

BACKGROUND ART

Nevertheless, manufacturing GaN single-crystal substrates is not a simple matter. Inasmuch as heating solid GaN does not liquefy it, crystals cannot be formed by the ordinary Bridgman or Czochralski methods that grow a crystal from a melt. Granted that applying ultra-high pressure to and heating GaN can make it into a melt, doing so is difficult nonetheless, and the fact that large-scale crystals cannot thus be made is obvious.

GaN layers and InGaN layers of some 1 µm, or 1 µm or less, fabricated onto a sapphire substrate are currently being fashioned by vapor-phase deposition techniques, which include HVPE, MOC, AND MOCVD. Efforts are being made to produce thick GaN crystal by vapor-phase deposition techniques such as these for growing thin films.

However, being that these originally are technologies for depositing thin films 1 µm and under onto sapphire substrates, they are in the first place notorious for incidents of defects. If nothing but LEDs are fashioned onto a sapphire substrate, since the GaN layer would be thin the stress would be small; but with stress being stepped up, increasing defects and distortion, in the film as the thickness is built up in order to produce bulk crystal, and with it peeling off from the substrate, thick material cannot be obtained.

A. Epitaxial Lateral Overgrowth

In this regard, a technique called epitaxial lateral overgrowth (ELO) has been devised. Literature on the subject includes, for example:

1) Akira Sakai, and Akira Usui. *Reduction of dislocation density in GaN films by epitaxial lateral overgrowth*. OYO BUTSURI (A monthly publication of The Japan Society of Applied Physics), vol. 68, No. 7 (1999), p. 774.
2) Akira Usui. *Thick Layer Growth of GaN by Hydride Vapor Phase Epitaxy*. Transactions of the Institute of Electronics, Information and Communication Engineers, C-11, vol. J81-C-11, No. 1 (1998), pp. 58-64.
3) Kensaku Motoki et al. *Preparation of Large Freestanding GaN Substrates by Hydride Vapor Phase Epitaxy Using GaAs as a Starting Substrate*. Jpn. J. Appl. Phys., Vol. 40 (2001), pp. L140-L143.
4) Japanese Unexamined Pat. App. Pub. No. 2000-22212. GaN Single-Crystal Substrate and Method of Its Manufacture.
5) Japanese Unexamined Pat. App. Pub. No. 2000-12900. GaN Single-Crystal Substrate and Method of Its Manufacture.

Figure 1:
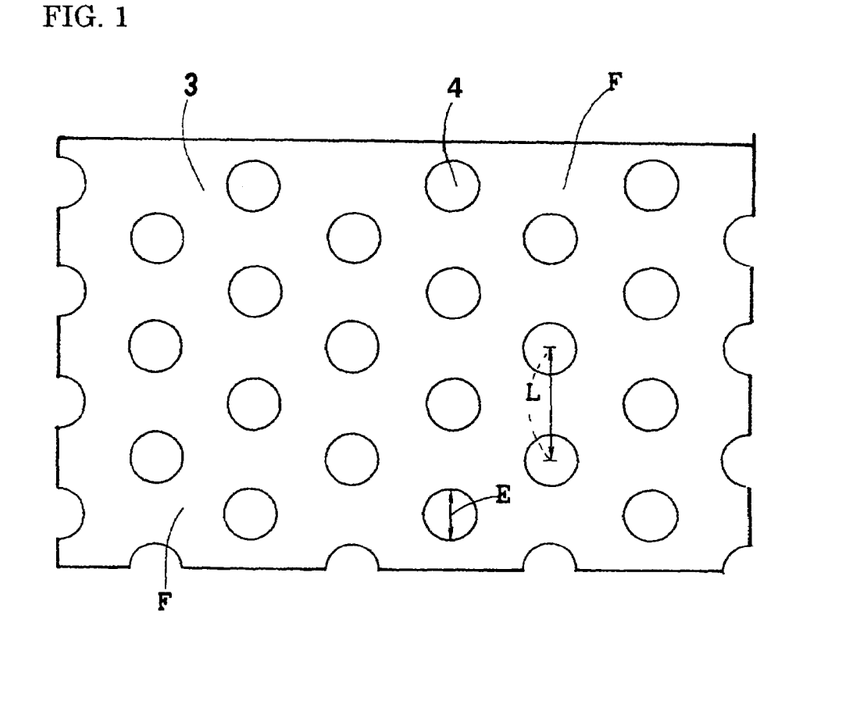
FIG. 1 is a partial plan view of a mask in which round windows are disposed at the vertices of equilateral triangles in an iterative pattern spread over with equilateral triangles—an ELO mask for growing a GaN thin film with few defects.
Figure 2:
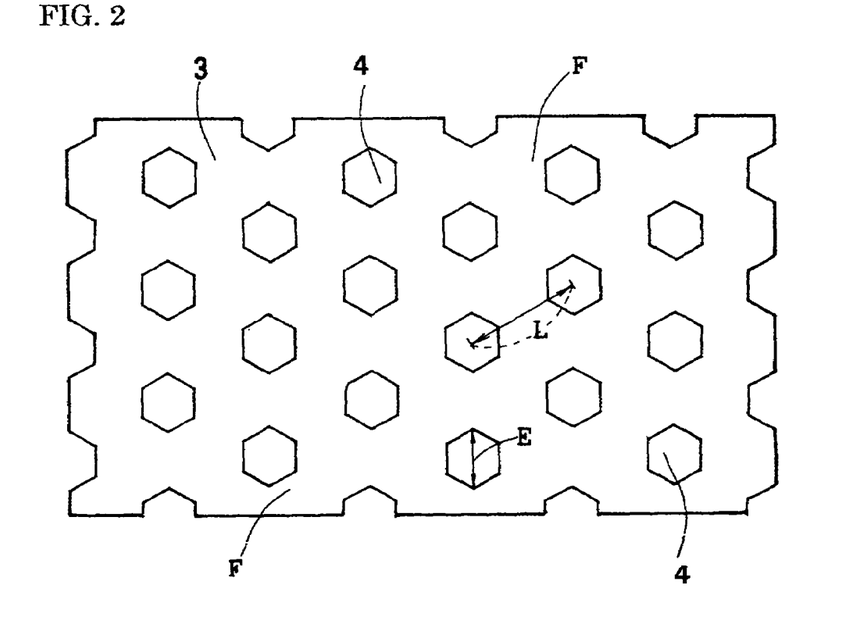
FIG. 2 is a partial plan view of a mask in which regular-hexagonal windows are disposed at the vertices of equilateral triangles in an iterative pattern spread over with equilateral triangles—an ELO mask for growing a GaN thin film with few defects.

ELO is a method of decreasing dislocations by: covering a planar substrate surface over its entirety with equilateral triangles whose sides are L (several µm); putting a mask F, perforated with windows (size E) positioned to fit the vertices of the equilateral triangles, on the substrate; and growing GaN through the top of the mask. Mask shapes are illustrated in FIGS. 1 and 2. In FIG. 1, round windows are iterated in an array according to the pattern of the equilateral triangle vertices. In FIG. 2, regular-hexagonal windows are iterated in an array according to the pattern of the equilateral triangle vertices. The ELO mask F includes the portion 3 that covers, and the windows 4, while the contour of the windows 4 can be of all sorts, such as round, polygonal, stripes, etc. A mask thus in which an equilateral-triangle window pattern is repeated is formed onto a sapphire substrate, and GaN is vapor-phase deposited through the top of the mask. The mask material is a substance—SiN or $SiO_2$—which GaN does not grow.

Figure 3:
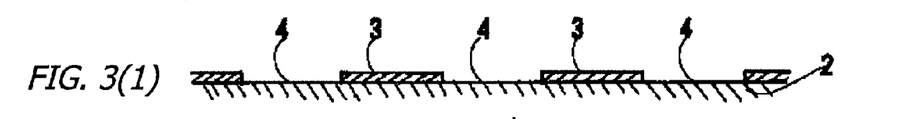
FIG. 3 is diagrams for explaining an ELO deposition method wherein a GaN growth-resistant mask in which a plurality of windows is disposed is provided on a substrate and GaN is grown through the windows.

An ELO film-deposition procedure is represented in FIG. 3. FIG. 3(1) depicts a sectional view of a situation in which the ELO mask F having the covering portion 3 and windows 4 has been formed on top of an under-substrate 2. FIG. 3(2) depicts a situation in which GaN crystal seeds 5 have been deposited on the windows 4 by vapor-phase deposition. Tiny crystal seeds grow on the substrate surface in the isolated windows. The crystal directions are determined so as to coordinate with the substrate. Atop the mask crystal seeds are not produced. The material of the ELO mask acts to suppress GaN growth. As growth proceeds the isolated crystal seeds gradually bulge and coalesce, turning into islands. The islands join and take on a thin-film form. The window interiors eventually become covered with a GaN thin-film of even membrane thickness. FIG. 3(3) depicts a situation in which the GaN has grown into a thin film 6. Because the islands coalesce their boundaries turn into complex crystalline defects. While high-density defects of this sort are produced, along with the film growth the defects stretch upward as they are. This forms dislocations extending in the perpendicular direction. The dislocations stretch along as they are, without diminishing. This is kept up since there are high-density dislocations from the first.

Having grown to the height of the mask the GaN thin film grows further, higher than the mask; but because GaN does not grow on the mask, GaN crystal 7 starts to protrude in a bell shape, as illustrated in FIG. 3(4). The sloping faces 23 are called facets. The bottom faces of the facets 23 are equivalent planes of indices {1-101}, {2-1-12}. The bell-shaped formations advance and the GaN film grows, filling out into deposition-film windows through neighboring windows and taking on pyramid shapes 8. The dislocations 20 stretch heading upward identically with the growth direction. This is illustrated in FIG. 3(5). Once the GaN becomes pyramidal, that form is sustained, and since it can extend no further upward, the GaN film rides onto the mask. The facets 24 at this point are referred to as "critical facets." Now the growth proceeds sideways along the top of the mask, with the facets being sustained. The dislocations bend 90° at the critical facets 24, becoming transverse dislocations 22. By bending over, the dislocations decrease at this time. GaN trapezoidal-pyramid crystal in a situation of this sort is illustrated in FIG. 3(6).

The thin-film growth advances horizontally in the form of regular hexagonal pyramids, inasmuch as there are 6 equal facets. Since six lateral facets are produced, in actuality the growing crystal turns into trapezoidal hexahedrons and spreads. When the growth atop the mask proceeds, the lumps of GaN crystal that have grown through neighboring windows come into contact in a dashed line 25 perpendicular to the windows (FIG. 3(7)). Thereafter the GaN crystal grows to fill in the channels bordering the regular hexahedrons. The border channels 26 become filled. The dislocations 22 having extended across from either side collide in the border channels 26, and the majority stops there. When the crystal growing through neighboring windows coalesces and the outer surface becomes flat, as illustrated in FIG. 3(8), the direction of growth switches upward once more. This means that the growth direction switches twice. Although the direction in which the dislocations 22 extend again changes to upward, most of them cancel each other out. The fact that the growth heads upward subsequent to reduction in the dislocation density means that GaN crystal in which dislocations are comparatively few is produced. Those are the essentials of ELO.

One more advance technology in connection with growing GaN and which forms a basis for the present invention is not a well-known public technology as is ELO: It has been created by the inventors of the present invention, but not yet announced. Particles of a metal and a dielectric are. placed atop a substrate, over which shut-off, defect-gathering regions (closed defect-gathering regions H) are formed; and surrounding them concentrically, low-dislocation concomitant single-crystal regions Z where defects are few and the electro-conductivity is high, are formed; and in the intervening gaps, low-dislocation remaining single-crystal regions Y are formed. Once they have formed dislocations do not disappear, but because they are absorbed by the closed defect-gathering regions H, dislocations in the other regions—the low-dislocation concomitant single-crystal regions Z and the low-dislocation remaining single-crystal regions Y—decrease.

Figure 4:
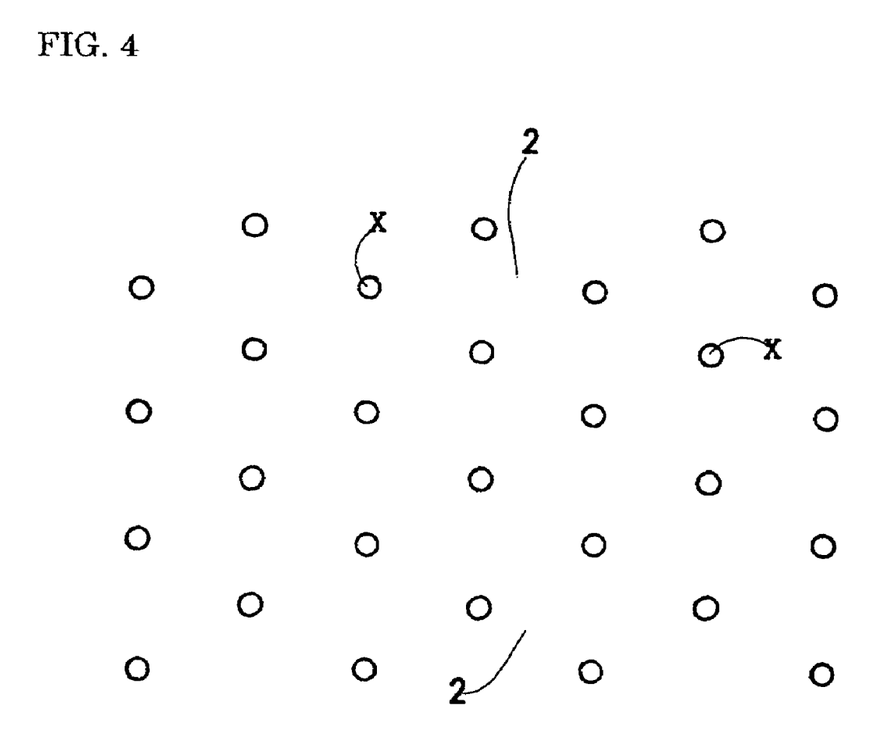
FIG. 4 is a plan view of a situation in which defect-seeding masks—material for growing GaN while accumulating GaN defects, disposed in the vertex positions of iterated equilateral triangles—have been provided on a single-crystal under-substrate of any one of sapphire, GaAs, InP, Si, SiC, spinel or GaN, or an under-substrate in which a GaN buffer layer has been grown onto a single-crystal substrate.
Figure 5:
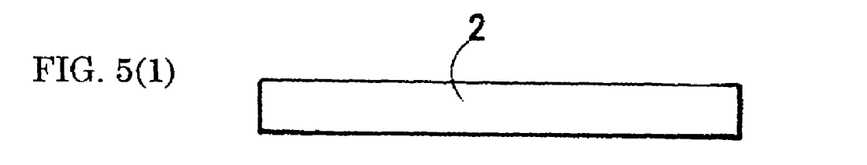
FIG. 5 is a sectional view illustrating process steps of manufacturing a GaN substrate by forming a defect-seeding mask X onto an under-substrate, or onto a GaN buffer layer built onto an under-substrate, and thereon growing a GaN crystal.

These regions as such cannot be seen with an SEM nor a TEM; the low-dislocation concomitant single-crystal regions Z and the low-dislocation remaining single-crystal regions Y can be distinguished and viewed by means of CL (cathode luminescence). FIG. 4 represents a plan view of a situation in which defect-seeding masks X have been disposed atop an under-substrate 2. These are round-patterned from a dielectric such as a high melting-point metal, $SiO_2$, or SiN. They are also situated in the vertex positions in a pattern of iterated equilateral triangles. The period and diameter of the defect-seeding masks X (period M, diameter B), however, are far larger than those of the mask F (period L, size E) for ELO (M>>L; B>>E). A seeding-mask technique will be explained according to FIG. 5. FIG. 5(1) represents the sapphire under-substrate 2. FIG. 5(2) represents a situation in which a uniform GaN buffer layer 52 has been formed onto the sapphire under-substrate 2. FIG. 5(3) is a sectional view of a situation in which the defect-seeding masks X, which have a growth-suppressing action, have been set atop the GaN buffer layer 52.

Figure 6:
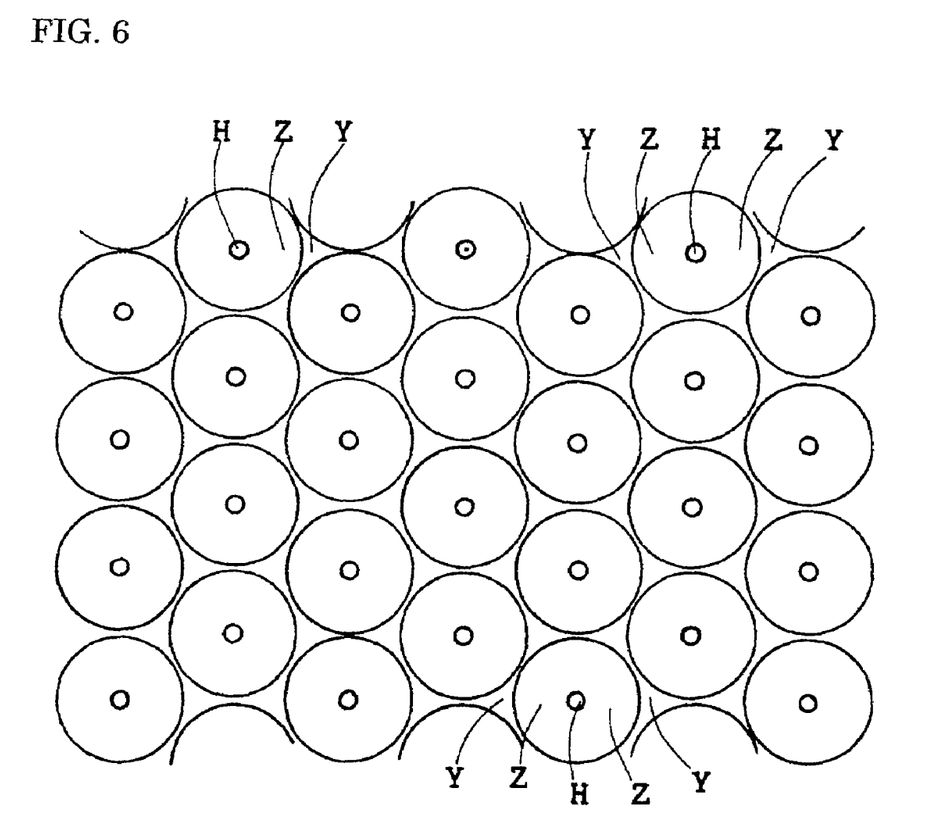
FIG. 6 is a diagram of a pattern seen when a GaN that has grown by a defect-seeding mask method is observed by CL (cathode luminescence). What has grown from the seeding masks X are the closed defect-gathering regions H; the portions of the GaN that have grown concentrically surrounding the seeding masks X are the low-dislocation concomitant single-crystal regions Z; and what is outside the concentric circles are the low-dislocation remaining single-crystal regions Y.

FIG. 5(4) represents a situation in which GaN has been grown onto the buffer layer 52 and seeding masks X by vapor-phase deposition. The closed defect-gathering regions H grow atop the defect-seeding masks X. Surrounding them the low-dislocation concomitant single-crystal regions Z, which have facets 53, grow. The low-dislocation remaining single-crystal regions Y grow along flat faces 54 on the boundaries. The technique thus yields a crystal in which defects are localized into the closed defect-gathering regions. A single crystal as an entirety, with the defects being localized into the closed defect-gathering regions, the leftover portions (Y and Z) of the crystal turn out to be low-dislocation, low-defect. FIG. 5(5) represents a subsequent situation in which a GaN substrate having a flat surface has been obtained by shaving away the reverse-side under-substrate material and planarizing the product. FIG. 6 represents a microscopic observation by CL (cathode luminescence). The disk-shaped areas where the low-dislocation concomitant single-crystal regions Z are appear dark and are therefore readily apparent. Without CL, since these would be transparent viewed under a microscope, they could not be discerned.

In early-stage growth with an ELO mask the dislocations within the GaN decrease. They do so in that the dislocations diminish by canceling each other out and thus are in actuality reduced. The defect-seeding mask method (not publicly known) decreases dislocations in the leftover regions by concentrating defects in mid-stage growth into the closed defect-gathering regions H.

DISCLOSURE OF INVENTION

Having in mind the desirability of employing both the ELO and the defect-seeding mask methods together to manufacture low-dislocation GaN single crystals, the present inventors thought that thus GaN single crystals with still lower dislocation density should be obtainable. Based on such expectations, an actual $SiO_2$ mask was fashioned and put to the test in crystal growth. An ELO mask having iterated fine windows and a defect-seeding mask having iterated large covering portions were formed from an $SiO_2$ layer. $SiO_2$ has demonstrated proven results as an ELO mask and thus has worked well for ELO deposition, but it has not worked well as the seeds for a defect-seeding mask. Initially it was the case that a GaN layer with many defects grew, but eventually that disappeared and it turned out that GaN with few defects ended up growing on the seeds. This meant that $SiO_2$ does not have a seeding function, which is a problem.

The ELO mask must be of a material that suppresses GaN growth. Although the seeds for concentrating defects also suppress GaN growth, it should be the case that the action that concentrates dislocations is different from merely a growth-suppressing action. With this reasoning in mind, the present inventors repeated experiments. As a result, they learned that a material that should serve as defect-concentrating seeds is different from an ELO mask material suitable for suppressing growth.

The present invention, combining ELO and defect-seeding mask methods, provides complementarily atop a substrate, an ELO mask F that reduces early-stage defects and a defect-seeding mask X that brings about concentration of defects during growth, wherein thick GaN crystal is grown thereon by vapor-phase deposition. $SiO_2$, SiN and SiON are utilized as the material for the ELO mask, while Pt, Ti and Ni are utilized as the material for the defect-seeding mask. The present invention pertains to substrates for growing gallium nitride, to methods for fashioning the substrates, and to gallium nitride deposition.

1. Substrate for Gallium Nitride Deposition

A gallium-nitride deposition substrate in the present invention is made from: an under-substrate being a single crystal of whichever of sapphire, GaAs, InP, Si, SiC, spinel or GaN, or an under-substrate wherein formed onto a single crystal substrate of these is a GaN buffer layer; defect-seeding masks X made from whichever of Ti, Pt or Ni, arrayed regularly over the under-substrate and, not having windows, being covering pieces only, and serving as seeds for generating closed defect-gathering regions H; and an ELO mask made from whichever of SiON, $SiO_2$ or SiN, having a covering portion and numerous windows being arrayed regularly at a small period, and provided atop the under-substrate regularly and complementarily with the defect-seeding masks X.

Letting E be the size of the windows in the ELO mask F, and L be the distance between centers of neighboring windows, then it naturally follows that E<L. This means that the window arraying rule is so as to range them in the vertices of regularly repeating polygons that. Such arrays are, for example, ones in which the windows are ranged in the vertices of equilateral triangles, in which they are ranged in the vertices of groups of regularly repeating squares, or in which they are ranged in the vertices of groups of regularly repeating regular hexagons.

With regard to the distance M between centers of the defect-seeding masks X and their masking diameters (or widths) B, it naturally follows that B<M. M and B are far larger than either E or L. However, the area S(X) of the defect-seeding masks X is smaller than the area S(F) of the ELO mask F (i.e., S(X)<S(F)). With the defect-seeding masks X being whichever of Ti, Pt or Ni, the ELO mask F is rendered whichever of SiON, $SiO_2$ or SiN. The fact that the mask materials in this way differ is a key point of the present invention.

Optionally the top of the under-substrate may be halved from the start, and one part covered only with the defect-seeding mask material and the other part covered only with the ELO mask material.

Nevertheless, since this would amount to an increased time and effort in etching, the ELO mask material and the defect-seeding mask material may be formed sequentially onto the under-substrate (defect-seeding mask/ELO mask/under-substrate), and part of the defect-seeding mask material and part of the ELO mask material may be removed.

Also possible is the reverse of this, wherein the defect-seeding mask material and the ELO- mask material are coated in turn onto the under-substrate (ELO mask/defect-seeding mask/under-substrate), and part of the ELO mask material and part of the defect-seeding mask material are removed. However, with the ELO mask windows have to be bored, exposing the sapphire substrate or GaAs substrate, but with the defect-seeding masks only the masking portions need be, which complicates the etching. And depending on the combination of materials, in some cases etching may be impossible.

2. Method for Manufacturing Gallium-Nitride Deposition Substrate

Figure 9A:
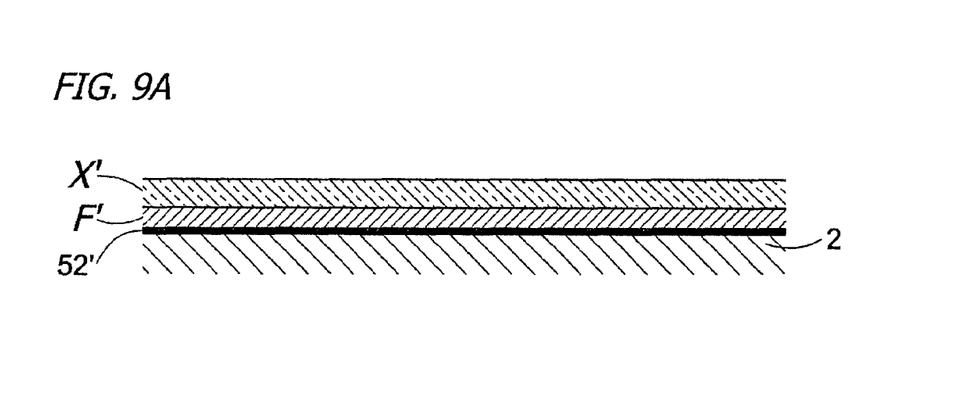
FIG. 9A illustrates a first thin film, which is for an ELO mask, formed atop a buffer-layer-coated under-substrate, and a second thin film, which is for a defect-seeding mask, formed atop the first thin film.
Figure 9B:
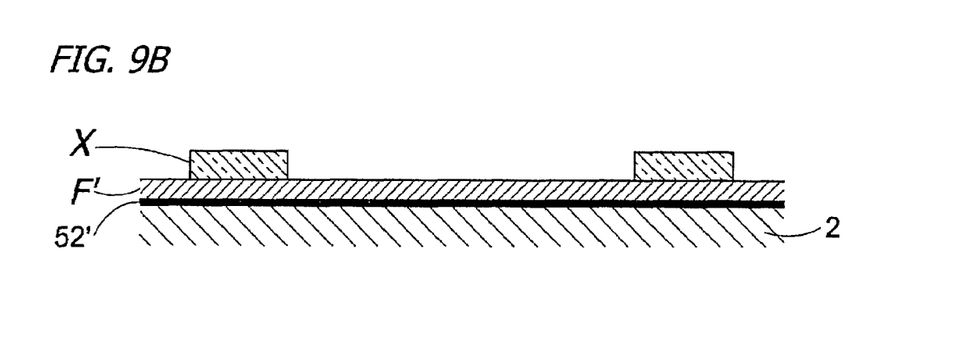
FIG. 9B illustrates the structure of FIG. 9A, with portions of the second thin film selectively removed to partially expose the underlying first thin film.
Figure 9C:
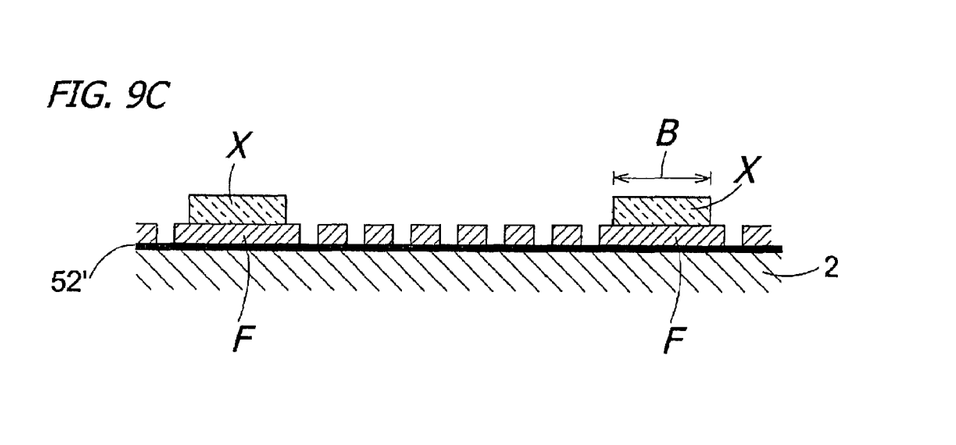
FIG. 9C illustrates a prepared gallium-nitride deposition substrate, being the structure of FIG. 9B, with the exposed portions of the first thin film having been etched to form patterned windows therein.

A thin film F' for an ELO mask of SiON, $SiO_2$ or SiN, is formed atop an under-substrate substrate being a monocrystal of whichever of sapphire, GaAs, InP, Si, SiC, spinel or GaN, or an under-substrate wherein formed onto a monocrystal substrate of these is a GaN buffer layer 52'; further, thereon a thin film X' for a defect-seeding mask, made from whichever of Ti, Pt or Ni is formed. The substrate structure at this stage is illustrated in FIG. 9A. By etching, a portion of the thin film for the defect mask that is where the ELO mask F will be is removed; this stacie is illustrated in FIG. 9B. By etching, regularly arrayed and ranged windows in the exposed thin film of whichever of SiON, $SiO_2$ or SiN is formed; this stacie is illustrated in FIG. 9C.

Figure 9D:
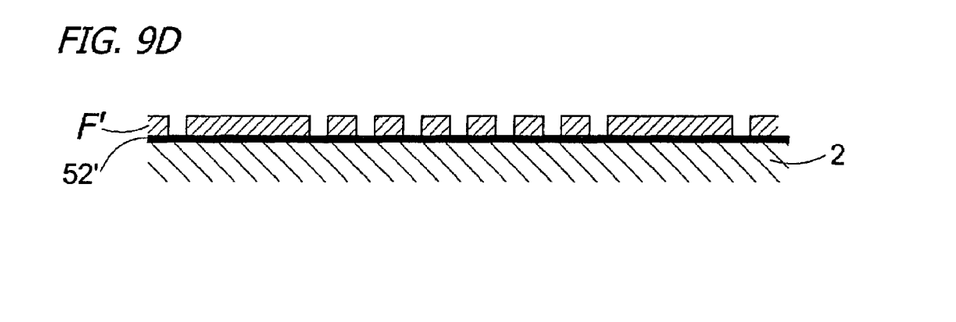
FIG. 9D illustrates a first thin film in an alternate embodiment of manufacturing a gallium-nitride deposition substrate according to the present invention, in which the ELO-mask-forming thin film formed atop the buffer-layer-coated under-substrate has been etched to form patterned windows, prior to the formation, on select portions of the remaining first thin film, of defect-seeding-mask-forming second thin films.
Figure 9E:
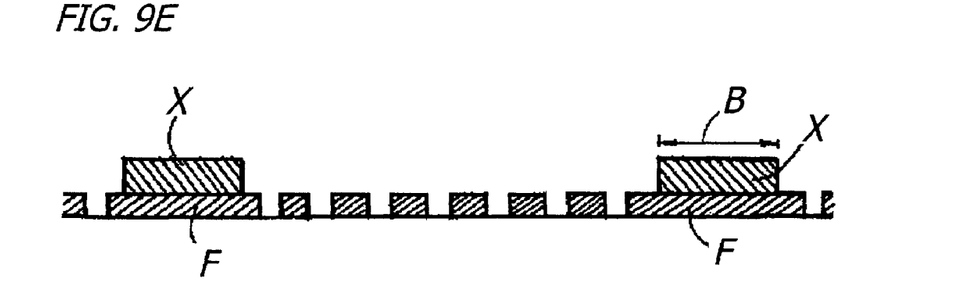
FIG. 9E represents the two-ply mask thus according to the present invention with the ELO mask, composed of any one of SiN, SiO$_2$ or SiON, shown isolated from the under-substrate (not illustrated in FIG. 9E). which is a single-crystal substrate of any one of sapphire, GaAs, InP, Si, SiC, spinel or GaN, or one in which a GaN buffer layer has been provided thereon, and with the defect-seeding masks provided atop the ELO mask.

A thin film for an ELO-mask, of whichever of SiON, $SiO_2$ or SiN, is formed atop an under-substrate being a monocrystal of whichever of sapphire, GaAs, InP, Si, SiC, spinel or GaN, or an under-substrate wherein formed onto a monocrystal substrate of these is a GaN buffer layer; regularly arrayed and ranged windows are formed in a portion where the ELO mask will be. The substrate structure at this stage is illustrated in FIG. 9D. In portions of the mask of whichever of SiON, $SiO_2$ or SiN where defect-seeding masks X will be, thin films for the defect-seeding masks, made from whichever of Ti, Pt or Ni, are formed; this stage is illustrated in FIG. 9C.

In cases where Pt is to be put onto whichever of $SiO_2$, SiN or SiON, since it does not adhere well as such, a Ti layer is interposed in between. In cases where ELO mask is $SiO_2$, the layer structure would be Pt/Ti/$SiO_2$. Inasmuch as the Ti therein is for increasing the adhesiveness, it would not be the defect-seeding masks, but of course Ti on its own can be the defect-seeding masks. There are nine possibilities as follows.

Pt/Ti/$SiO_2$/substrate; Pt/Ti/SiON/substrate; Pt/TI/SiN/substrate; Ti/$SiO_2$/substrate; Ti/SiON/substrate; Ti/SiN/substrate; Ni/$SiO_2$/substrate; Ni/SiON/substrate; and Ni/SiN/substrate.

3. Method for Manufacturing Gallium-Nitride Substrate

In a method of manufacturing a gallium-nitride substrate in the present invention, a GaN single crystal is grown by vapor-phase deposition by: putting into a vapor-phase deposition furnace a mask-attached single crystal substrate of whichever of sapphire, GaAs, InP, Si, SiC, spinel or GaN, produced by forming an under-substrate being a single crystal of whichever of sapphire, GaAs, InP, Si, SiC, spinel or GaN, or an under-substrate wherein formed onto a single crystal substrate of these is a GaN buffer layer, and onto it, a thin film for an ELO-mask, made from whichever of SiON, $SiO_2$ or SiN; further, thereon a thin film for a defect-seeding mask, made from whichever of Ti, Pt or Ni is formed; by etching, a portion of the thin film for the defect-seeding mask that is where the ELO mask F will be is removed; and by etching, regularly arrayed and ranged windows in the exposed thin film of whichever of SiON, $SiO_2$ or SiN are formed; and over the mask-attached substrate a raw material containing $NH_3$ and a raw material containing Ga is supplied; and an independent low-dislocation, low defect GaN single crystal substrate is obtained by: initially generating GaN crystal seeds atop the under-substrate exposed in the windows in the ELO mask F, letting GaN crystal that has gone beyond the windows without the GaN crystal growing on top of the ELO masking portions nor the defect-seeding masks grow laterally onto the ELO masking portions; after crystal films that have grown laterally from the windows have respectively coalesced, letting upward-heading low-dislocation growth above the ELO mask F proceed, and GaN accumulation above the defect-seeding masks X begin, so that GaN closed defect-gathering regions H containing many defects proceed to grow; and once sufficiently thick GaN crystal has formed, halting the GaN deposition, taking the GaN crystal with the attached under-substrate out of the vapor-phase deposition furnace, and removing the under-substrate and the masks F and X by etching or polishing.

GaN deposition in which low-dislocation single crystal growth is kept up without increasing defects over the ELO mask F, and in which defects are concentrated onto the defect-seeding masks X, is realized. The fact that defects are concentrated into closed defect-gathering regions H reduces GaN defects over the ELO mask.

BRIEF DESCRIPTION OF THE DRAWINGS

FIG. 3(1) is a sectional view of a situation in which the window-containing mask has been formed on the substrate. FIG. 3(2) is a sectional view illustrating a situation in which GaN crystal seeds have been created in the window areas on the substrate surface. FIG. 3(3) is a sectional view illustrating a situation in which a thin layer of GaN has grown in the window areas on the substrate surface. FIG. 3(4) is a sectional view depicting a situation in which GaN crystal has grown beyond the height of the windows into trapezoidal pyramid shapes having facets. FIG. 3(5) is a sectional view depicting a situation in which GaN crystal in trapezoidal pyramids having facets has grown beyond the window height into pyramid shapes having facets. FIG. 3(6) is a sectional view illustrating GaN crystal in facet-possessing pyramid shapes having grown laterally beyond the rims of the windows and taken on the appearance of trapezoidal pyramids. FIG. 3(7) is a sectional view illustrating a situation in which GaN crystal in facet-possessing trapezoidal pyramid shapes has grown laterally beyond the rims of the windows, and crystal that has grown through neighboring windows has come into contact in boundary surfaces where the perpendicular dashed lines lie. FIG. 3(8) is a sectional view of a situation in which GaN crystal that has grown through neighboring windows has filled over the boundary lines.

FIG. 5(1) is a sectional view of an under-substrate. FIG. 5(2) is a sectional view depicting a situation in which a uniform GaN buffer layer has been furnished atop the under-substrate. FIG. 5(3) is a sectional view of a situation in which defect-seeding masks X have been furnished atop the GaN buffer layer. FIG. 5(4) is a sectional view depicting that when GaN crystal is grown onto the defect-seeding masks X. Closed defect-gathering regions H grow atop the defect-seeding masks X; above the areas apart from them grow low-dislocation concomitant single-crystal regions Z with few defects and having sloping facets; and low-dislocation remaining single-crystal regions Y grow on areas corresponding to boundaries between neighboring masks X FIG. 5(5) is a sectional view of a situation in which a flat GaN has been rendered by polishing away the peaks on the grown GaN, and eliminating the under-substrate.

FIG. 9 is a sectional structural diagrams illustrating stages in manufacturing, according to the present invention, a gallium-nitride deposition substrate, wherein.

BEST MODE FOR CARRYING OUR INVENTION

The present invention furnishes an ELO mask F for reducing initial-stage defects, and defect-seeding masks X that bring about defect concentration during growth, complementarily atop an under-substrate, and grows thereon thick-crystal GaN by means of vapor-phase deposition. Once a sufficiently thick GaN single crystal has been grown the under-substrate and masks are removed by polishing.

1. Under-substrate—A single-crystal substrate that enables GaN growth is utilized: sapphire single crystal, GaAs single crystal, spinel single crystal, Si single crystal, InP single crystal, SiC single crystal, GaN single crystal, or an under-substrate in which a thin GaN buffer layer is formed superficially on one of these single crystals.

2. ELO mask—May be SiN, SiON or SiO$_2$. These dielectric layers are formed by sputtering or CVD. Film thickness is some 30 nm to 200 nm.

Figure 10:
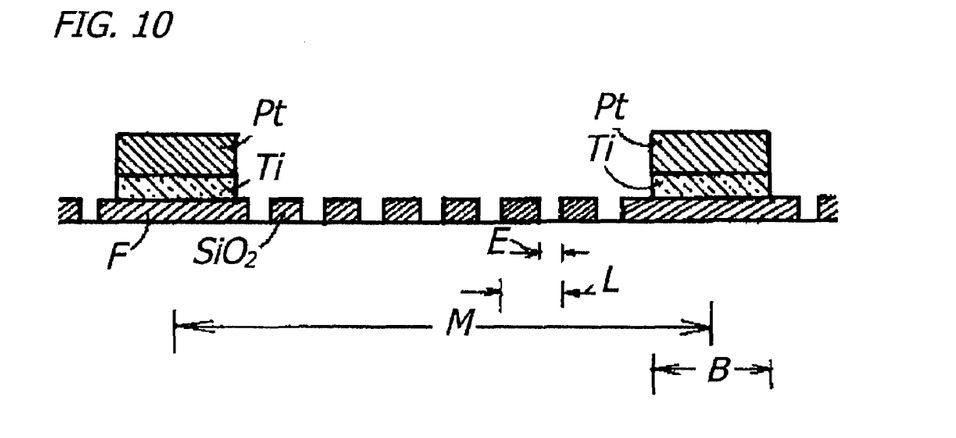
FIG. 10 is a sectional view illustrating the structure of a two-ply mask for a GaN-deposition substrate involving the present invention, wherein an ELO mask composed of SiO$_2$ is shown isolated from the under-substrate (single-crystal substrate of any one of sapphire, GaAs, InP, Si, SiC, spinel or GaN, or one in which a GaN buffer layer has been provided thereon), and defect-seeding masks made up of Pt/Ti are provided atop the ELO mask.

3. Defect-seeding mask—May be Pt, Ti or Ni. These metal layers are formed by vapor deposition, sputtering, or CVD. Although forming the seeding masks directly on top of the substrate is acceptable, it is simpler to layer a preform onto the ELO mask and remove the unnecessary portions. That case means putting Pt, Ti or Ni on top of SiN, SiON or SiO$_2$. Wherein Pt is used, a Ti layer is interposed in order to improve the cohesiveness. FIG. 9 presents a sectional view of a two-ply mask in which defect-seeding masks X are layered onto an ELO mask. FIG. 10 illustrates an example in which Pt/Ti defect-seeding masks are stacked and formed onto an SiO$_2$ ELO mask F.

4. ELO mask windows—The size of the ELO mask windows is some 0.5 µm to 2 µm. The windows are arranged so as to be positioned at the vertices of systematically spread regular polyhedral forms. A pattern in which equilateral triangles are spread throughout (equilateral triangle ELO), a pattern in which squares are spread throughout (square ELO), and a pattern in which regular hexagons are spread throughout (hexagon ELO) are possible. The distance L (L>E) between the centers of neighboring windows is some 1.5 to 5 µm. The windows in contour may be circles, ellipses, regular hexagons, equilateral triangles or squares. The aperture ratio a (ratio of the aperture proportional surface area to the total) is some 20% to 70%.

A mask in which round windows are disposed at the vertices in a pattern of distributed equilateral triangles is illustrated in FIG. 1. Letting the sides of the equilateral triangles forming the pattern be L (pattern period), and the diameter of the windows be E, then the aperture ratio σ is: $\sigma = \pi E^2 / 2 \cdot 3^{1/2} L^2$. A mask in which regular-hexagonal windows are disposed at the vertices in a pattern of distributed equilateral triangles is illustrated in FIG. 2. Letting the sides of the equilateral triangles forming the pattern be L, and the length of the longest diagonal of the regular-hexagonal windows be E, then the aperture ratio σ is: $\sigma = 3E^2/4L^2$.

Figure 7:
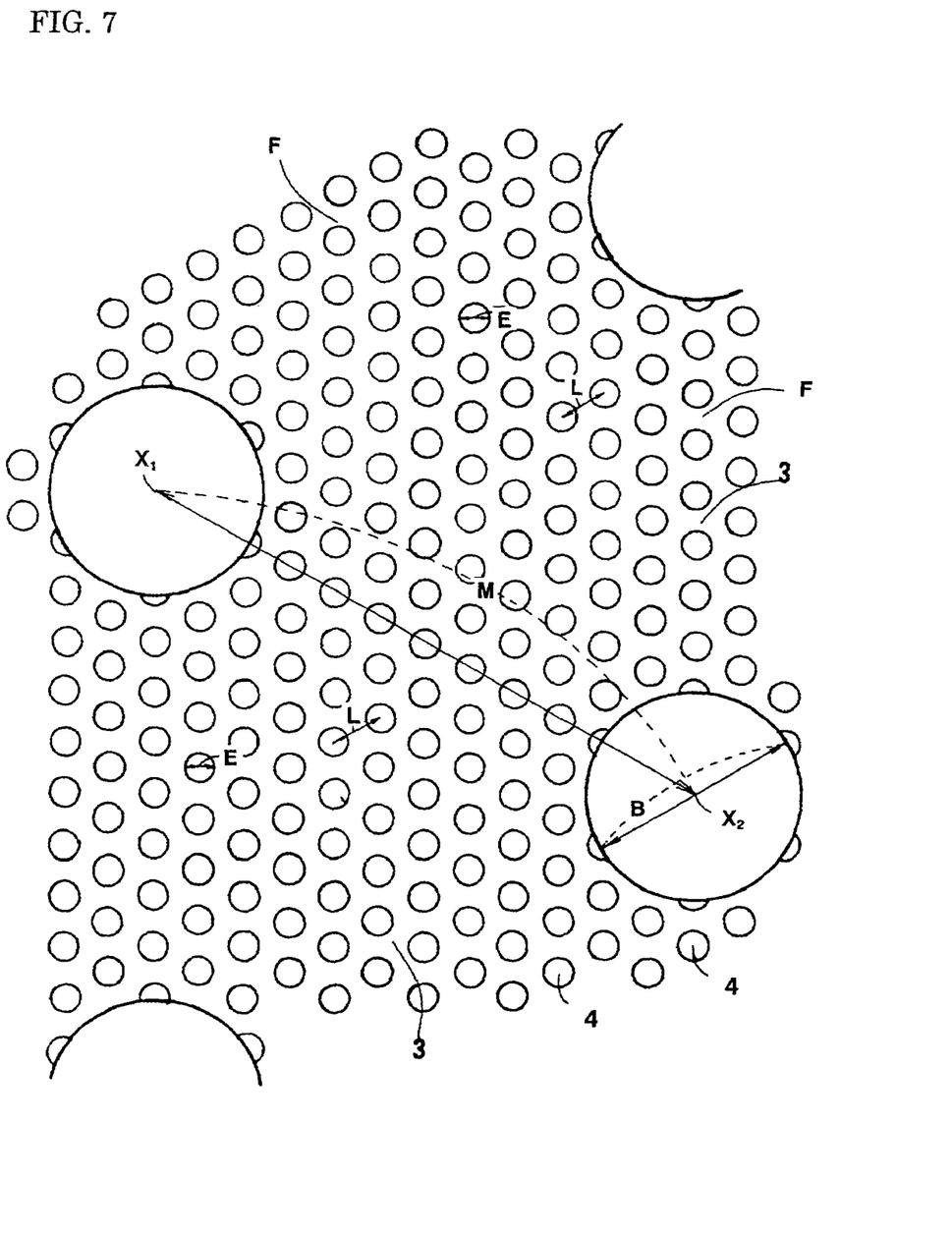
FIG. 7 is a plan view representing a situation in which an under-substrate has been complementarily covered by defect-seeding masks furnished on the vertices of a pattern of iterated equilateral triangles, and by an ELO mask furnished on the majority of the region apart from the seeding masks—being two-ply masking, an embodiment of the present invention. The arrangement of numerous tiny windows is the ELO mask; what amounts to large covering sections are the defect-seeding masks.
Figure 8:
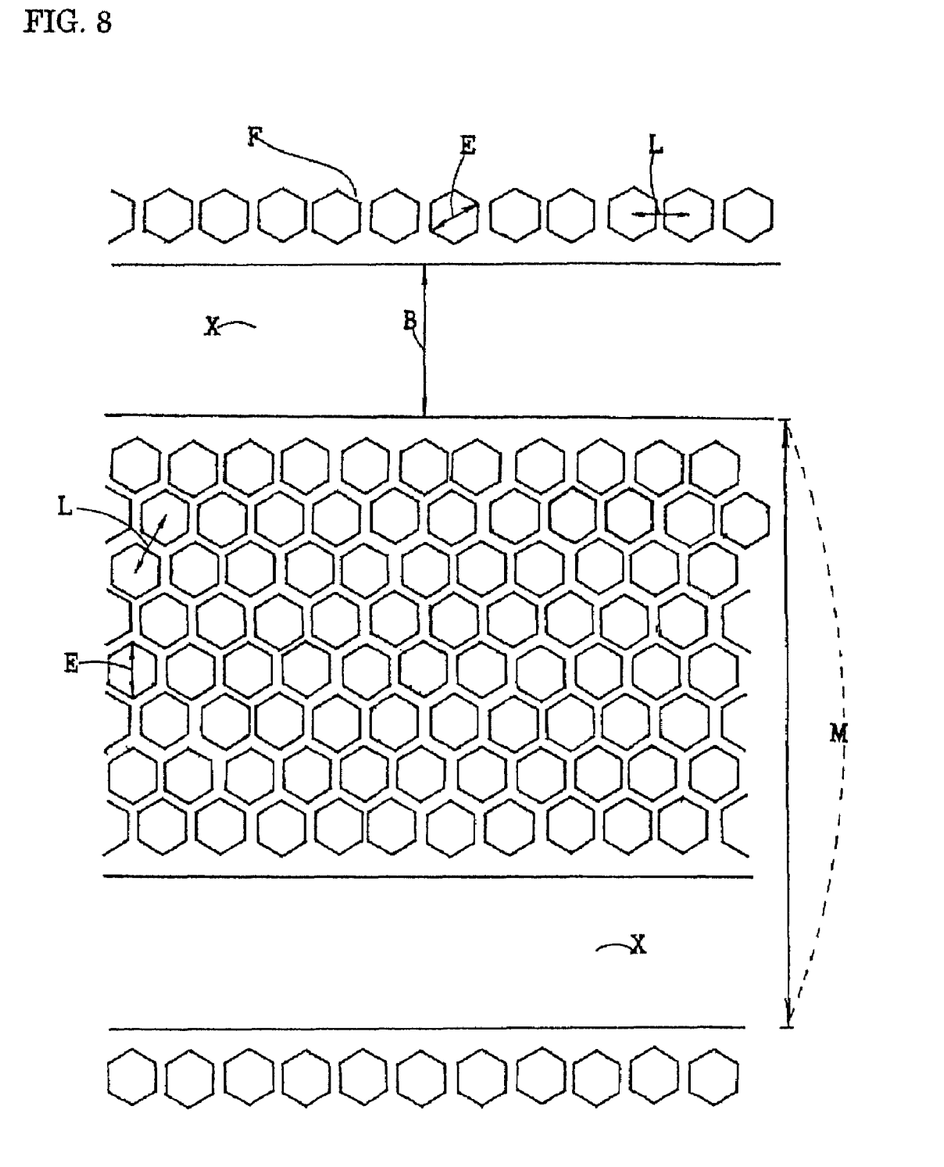
FIG. 8 is a plan view representing a situation in which an under-substrate has been complementarily covered by defect-seeding masks that are pattern of parallel stripes that iterate at a pitch M, and by an ELO mask furnished on the majority of the region apart from the seeding masks—being two-ply masking, an embodiment of the present invention. The arrangement of numerous tiny windows is the ELO mask; what amounts to large stripe-like covering sections are the defect-seeding masks.

5. Defect-seeding mask configuration—The defect-seeding masks X are masks that constitute covering pieces only, and do not have windows. The pattern diameter B of the defect-seeding masks X (width in the case where they are in stripe form) and the iteration period M are far larger than the window size E and iteration period L of the ELO mask (B>>E; M>>L). The masks in contour may be circles, squares, regular hexagons, rectangles, or strip shapes ("stripes"). If there are hermit-point circles, squares, regular hexagons, rectangles, or strip shapes, they will be regularly distributed two-dimensionally. The diameter B, the array period M, and the array mode constitute the pattern. In FIG. 7, round defect-seeding masks X are provided at the vertices of iterated equilateral triangles, and an ELO mask F is furnished in the space left over. The ELO mask part of the configuration contains the minute windows 4 and the covering portion 3. The large circular covering parts are the defect-seeding masks X. The diameter B of the defect-seeding masks X is far greater than the ELO mask window diameter E and the period L. The iteration period M of the defect-seeding masks X is larger than the period L of the ELO mask windows.

In instances where the seeding masks are strip-like (stripes) the longitudinal dimension will have the same length as the side of the under-substrate, and therefore only the width (B) and the iteration period M will be the parameters. The size B in the defect-seeding mask pattern is some 20 µm to 80 µm, with 50 µm or so being the easiest to work with. For example, defect-seeding masks X that are stripe-like, and whose width B=50 µm, are formed in parallel onto a GaAs under-substrate with period M=400 µm, and the ELO mask is formed in the intervening 350 µm belt-like regions. In other words, the pattern of the ELO and defect-seeding masks on the under-substrate can be rendered as "50 µm X: 350 µu F: 50 µm X: 350 µm F: . . . ," such that the pattern continues as though undulating. The product could be used as a substrate for manufacturing LD devices having a width of 400 µm. The direction extending parallel to the ELO- and defect-seeding mask pattern would be made to be in line with the LD stripes.

6. Crystal-growing methods—The GaN substrate crystal is manufactured by vapor-phase deposition in the same way that thin films are. Any of the methods set forth in the following is applicable. In whichever method, initially a buffer layer may be formed thinly (thinner than the masks) at low temperature, but a buffer layer can be done without.

1) HVPE (Hydride Vapor-Phase Epitaxy)

A vessel in which Ga metal is contained is laid into a hot-wall reactor, and with heaters finished at the periphery is heated to render molten Ga, onto which HCl+hydrogen gas is sprayed to make GaCl; this is guided downward and rests on a substrate that has been heated together with H$_2$+NH$_3$ gas, whereby GaN is synthesized and GaN crystal is built up onto the wafer.

2) MOC Method (Metalorganic Chloride Method)

Method according to which gas in which an organic metal, such as trimethylgallium, containing Ga is diluted with hydrogen, and HCl gas diluted with hydrogen, are reacted within a hot-wall furnace, synthesizing GaCl for the time being; this is reacted with NH$_3$ (+H$_2$) gas streamed in the vicinity of the wafer, whereby GaN thin film is deposited onto the heated wafer.

3) MOCVD (Metalorganic Chemical Vapor Deposition)

In a cold-wall reactor, a gas in which a Ga organic metal such as TMG is diluted with hydrogen, and a gas in which $NH_3$ is diluted with hydrogen, are sprayed onto a heated wafer, whereby GaN is synthesized and a crystal of GaN is built up onto the wafer. Method most frequently employed as GaN thin-film deposition technology.

An ELO mask F 350 μm in width, made of $SiO_2$ and having numerous regular-hexagonal windows, and defect-seeding mask stripes made of Pt/Ti and 50 μm in width, were formed at a 400 μm period onto a 2-inch GaAs wafer. The begin with a GaN buffer layer of 100 nm thickness was deposited at 450° C. by HVPE. The temperature was raised under an $NH_3$ atmosphere to 950° C. Further GaN deposition was carried out at the higher temperature of 950° C., whereby a GaN layer 100 μm in thickness was grown. Closed defect-gathering regions H were grown atop the defect-seeding masks; in the region concentrically surrounding them, low-dislocation concomitant single-crystal regions Z were grown; and in the boundary portions, low-dislocation remaining single-crystal regions Y were grown. The fact that these were formed (as in FIG. 6) across the entire substrate was confirmed.

INDUSTRIAL APPLICABILITY

In the present invention, an ELO mask for reducing early-stage defects and defect-seeding masks for triggering the concentrating of defects are furnished complementarily on a substrate that is single-crystal sapphire, GaAs or InP, or in which a GaN buffer layer has been provided thereon. A material, such as $SiO_2$, SiON or SiN, onto which GaN is extremely unlikely to grow is utilized as the ELO mask material, while a material, such as Pt, Ni or Ti, onto which GaN is unlikely to grow, but GaN crystal having many defects can be grown, is utilized for the defect-seeding masks.

Consequently, above the defect-seeding masks GaN defects that have become concentrated (closed defect-gathering regions H) do not vanish during growth. Conversely, on top of the ELO mask defect-concentrating regions are not produced.

Inasmuch as a high-density, dosed defect-gathering region forms in part of the region atop a defect-seeding mask, and the region other than that portion proves to be low in defects, viewed in terms of what remains, the manufacture of low defect-density GaN single crystal is realized.

The invention claimed is:

1. A method of manufacturing a gallium-nitride deposition substrate, comprising:
    forming a first thin film for an ELO-mask, made from one selected from SiON, $SiO_2$ or SiN, atop an under-substrate being a single crystal of one selected from sapphire, GaAs, InP, Si, SiC, spinel and GaN;
    forming regularly arrayed and ranged windows in a portion of said first thin film to define the ELO mask; and forming second thin films for defect-seeding masks, made from one selected from Ti, Pt or Ni on said first thin-film portions for defect-seeding masks.

2. A method of manufacturing a gallium-nitride deposition substrate as set forth in claim 1, wherein said under-substrate includes a GaN buffer layer formed onto said single crystal.

3. A method of manufacturing a gallium-nitride deposition substrate, comprising:
    forming a first thin film for an ELO-mask, made from one selected from SiON, $SiO_2$ and SiN, atop an under-substrate being a single crystal of one selected from sapphire, GaAs, InP, Si, SiC, spinel and GaN;
    forming a second thin film for a defect-seeding mask, made from one selected from Ti, Pt or Ni, onto said first thin film;
    by etching, removing a portion of said second thin film to expose said first thin film and thereby define where the ELO mask will be; and
    by etching, forming regularly arrayed and ranged windows in the exposed said first thin film.

4. A method of manufacturing a gallium-nitride substrate, comprising:
    growing a GaN single crystal by vapor-phase deposition by putting into a vapor-phase deposition furnace a GaN deposition substrate manufactured as set forth in claim 3;
    supplying over said GaN deposition substrate a raw material containing $NH_3$ and a raw material containing Ga;
    generating GaN crystal seeds atop the under-substrate exposed in the windows in the ELO mask;
    letting GaN crystal having gone beyond the windows without the GaN crystal growing on top of the ELO masking portions nor the defect-seeding mask grow laterally onto the ELO masking portions;
    after crystal films that have grown laterally from the windows have respectively coalesced, letting upward-heading low-dislocation growth above the ELO mask proceed, and GaN accumulation above the defect-seeding mask begin, so that GaN closed defect-gathering regions containing many defects proceed to grow; and
    once suffigently thick GaN crystal has formed, halting the GaN deposition, taking the GaN crystal with the attached under-substrate out of the vapor-phase deposition furnace, and removing the under-substrate and the ELO and defect-seeding masks by etching or polishing.

5. A method of manufacturing a gallium-nitride deposition substrate as set forth in claim 3, wherein said under-substrate includes a GaN buffer layer formed onto said single crystal.

6. A method of manufacturing a gallium-nitride substrate, comprising:
    growing a GaN single crystal by vapor-phase deposition by putting into a vapor-phase deposition furnace a GaN deposition substrate manufactured as set forth in claim 5;
    supplying over said GaN deposition substrate a raw material containing $NH_3$ and a raw material containing Ga;
    generating GaN crystal seeds atop the under-substrate exposed in the windows in the ELO mask;
    letting GaN crystal having gone beyond the windows without the GaN crystal growing on top of the ELO masking portions nor the defect-seeding masks grow laterally onto the ELO masking portions;
    after crystal films that have grown laterally from the windows have respectively coalesced, letting upward-heading low-dislocation growth above the ELO mask proceed, and GaN accumulation above the defect-seeding mask begin, so that GaN closed defect-gathering regions containing many defects proceed to grow; and
    once sufficiently thick GaN crystal has formed, halting the GaN deposition, taking the GaN crystal with the attached under-substrate out of the vapor-phase deposition furnace, and removing the under-substrate and the ELO and defect-seeding masks by etching or polishing.

* * * * *